United States Patent
Wendt

[11] Patent Number: 6,068,051
[45] Date of Patent: May 30, 2000

[54] CHANNELED HEAT SINK

[75] Inventor: Randall Dean Wendt, Aloha, Oreg.

[73] Assignee: Intel Corporation, Santa Clara, Calif.

[21] Appl. No.: 09/046,371

[22] Filed: Mar. 23, 1998

[51] Int. Cl.⁷ .................................................. H05K 7/20
[52] U.S. Cl. ................. 165/185; 165/80.3; 174/16.3; 257/722; 361/704; 361/720
[58] Field of Search .................. 165/80.3, 185; 174/16.3; 257/722; 361/704, 707, 710, 720

[56] References Cited

U.S. PATENT DOCUMENTS

| | | | |
|---|---|---|---|
| 3,217,793 | 11/1965 | Coe | 257/722 X |
| 4,054,901 | 10/1977 | Edwards et al. | 174/16.3 X |
| 4,204,248 | 5/1980 | Proffit et al. | 174/16.3 X |
| 4,215,361 | 7/1980 | McCarthy | 174/16.3 X |
| 4,261,005 | 4/1981 | McCarthy | 174/16.3 X |
| 4,509,839 | 4/1985 | Lavochkin | 257/722 X |
| 4,544,942 | 10/1985 | McCarthy | 174/16.3 X |
| 4,558,209 | 12/1985 | Hess | 361/704 X |
| 4,602,315 | 7/1986 | Breese | 174/16.3 X |
| 4,625,260 | 11/1986 | Jordan et al. | 361/720 X |
| 4,662,695 | 5/1987 | Ohkawara et al. | 174/16.3 X |
| 4,691,765 | 9/1987 | Wozniczka | 165/80.3 |
| 4,847,449 | 7/1989 | Jordan et al. | 361/720 X |
| 4,933,746 | 6/1990 | King | 257/722 X |
| 5,372,186 | 12/1994 | Taki et al. | 165/80.3 |

FOREIGN PATENT DOCUMENTS

| | | | |
|---|---|---|---|
| 160642 | 8/1985 | Japan | 257/718 |
| 191071 | 7/1993 | Japan | 361/710 |
| 6310884 | 11/1994 | Japan | 361/720 |

*Primary Examiner*—Leonard Leo
*Attorney, Agent, or Firm*—Blakely, Sokoloff, Taylor & Zafman LLP

[57] ABSTRACT

The heat sink includes a mounting block having a channel for clamping a device being coupled to the heat sink. The channel serves as a clamp to substantially eliminate relative rotation between the heat sink and the device when the device is being fastened to the heat sink. The heat sink further includes a first wall and a second wall wherein the first and second walls and the mounting block provide a substantially U-shaped body for the heat sink. In one embodiment, the heat sink includes a threaded nut aligned with a hole in the channel to ease alignment issues when the device is being fastened to the heat sink. In one embodiment, the heat sink includes convection fins extending from a U-shaped base and a U-shaped top of the heat sink. In one embodiment, the heat sink includes mounting pins inserted into the base of the heat sink. In one embodiment, the heat sink includes anti-tipping pins inserted into the base of the heat sink. The mounting pins and the anti-tipping pins have a knurled portion in one embodiment. Additional fillet between convection fins provides the anti-tipping pins with a gripping surface when they are inserted into the base. Additional fillet formed at the junction of the first and second wall and the mounting block provides the mounting pins with a gripping surface when they are inserted into the base. The U-shaped body is capable of being manufactured through extrusion.

20 Claims, 4 Drawing Sheets

DRY INTERFACE MATERIAL.
APPROXIMATELY .35 X .625 X .005 THICK
WITH A THERMAL IMPEDANCE OF .08 °C SQ. IN/W
INTERFACE MATERIAL TO ALIGN WITH BOTTOM EDGE.
MUST NOT OVERLAP VERTICAL EDGES.

DRY INTERFACE MATERIAL.
APPROXIMATELY .35 X .625 X .005 THICK
WITH A THERMAL IMPEDANCE OF .08 °C SQ. IN/W
INTERFACE MATERIAL TO ALIGN WITH BOTTOM EDGE.
MUST NOT OVERLAP VERTICAL EDGES.

CHANNELED HEAT SINK

FIELD OF THE INVENTION

This invention relates to the field of heat sinks. In particular, this invention is drawn to a heat sink design that provides a relatively high thermal dissipation capacity and eases the process of fastening the heat sink to both the device being cooled and the motherboard.

BACKGROUND OF THE INVENTION

One prior art heat sink design is a U-shaped heat sink stamped from sheet metal. The U-shaped heat sink is fastened to a component requiring heat dissipation. The component is typically soldered to a printed circuit board such as a motherboard. For some applications, the heat sink form factor may be small enough so that its mass can be supported by the legs of the component. The size of the heat sink, however, tends to increase as the thermal dissipation requirements increase. The legs of the component may not be sufficiently sturdy to support the larger heat sink.

The stamped heat sink can be fastened to the motherboard in order to provide support. The stamped heat sink can be manufactured with tabs that are inserted through the motherboard and then twisted or bent to hold the heat sink in place. Alternatively, another coupling mechanism such as spring clips can be soldered to the motherboard. The heat sink is then pushed onto the spring clips.

One disadvantage of the use of tabs is that the additional bending or twisting step is required when fastening the heat sink to the motherboard. Similarly, the additional steps may be required at the time of fastening the heat sink to the motherboard if spring clips are used.

Some applications require heavier duty heat sinks that are typically manufactured using an extrusion process rather than the stamping process. Due to limitations in the extrusion process, the extruded heat sink typically cannot be extruded with mounting pins or tabs. Regardless, additional manufacturing steps may be required at the time of fastening the heat sink to the motherboard even if mounting tabs or spring clips can be used with the extruded design.

Another disadvantage of prior art stamped or extruded heat sinks is that the component being cooled is typically fastened to the heat sink using a screw and a nut. This requires aligning holes in the component and the heat sink as well as the screw and the nut during assembly. When tightening the screw and nut, the component tends to rotate with respect to the heat sink. Unless the rotation is insubstantial, the component and the heat sink may need to be re-adjusted in order that both may be properly seated on the motherboard.

SUMMARY OF THE INVENTION

In view of limitations of known systems and methods, one of the objectives of the present invention is to provide a heat sink capable of being produced through extrusion.

The heat sink includes a mounting block having a channel for clamping a device being coupled to the heat sink. The channel serves as a clamp to substantially eliminate relative rotation between the heat sink and the device when the device is being fastened to the heat sink. The heat sink further includes a first wall and a second wall wherein the first and second walls and the mounting block provide a substantially U-shaped body for the heat sink. In one embodiment, the heat sink includes a threaded nut aligned with a hole in the channel to ease alignment issues when the device is being fastened to the heat sink. In one embodiment, the heat sink includes convection fins extending from a U-shaped base and a U-shaped top of the heat sink. In one embodiment, the heat sink includes mounting pins inserted into the base of the heat sink. In one embodiment, the heat sink includes anti-tipping pins inserted into the base of the heat sink. The mounting pins and the anti-tipping pins have a knurled portion in one embodiment. Additional fillet between convection fins provides the anti-tipping pins with a gripping surface when they are inserted into the base. Additional fillet formed at the junction of the first and second wall and the mounting block provides the mounting pins with a gripping surface when they are inserted into the base.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Heat dissipation is often required for some component on the motherboard of a computer system. Voltage regulators, for example, often require heat dissipation.

Figure 1:
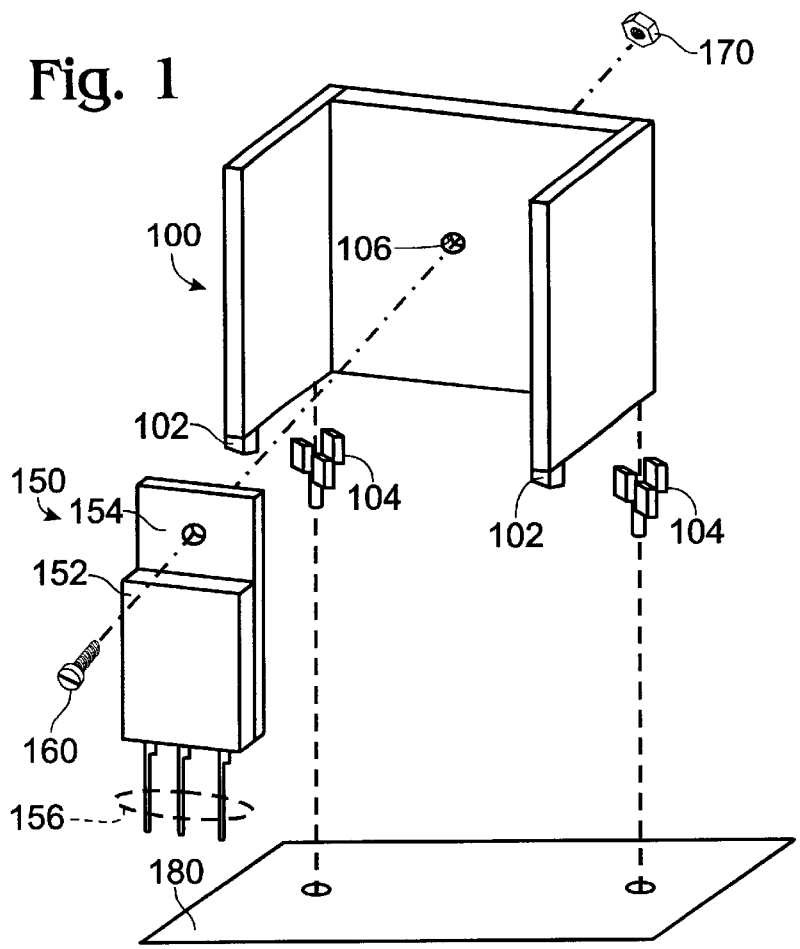
FIG. 1 illustrates a stamped heat sink.

FIG. 1 illustrates a heat sink 100 to be used in conjunction with device 150. In one embodiment, device 150 is a voltage regulator having a TO-220 form factor. Device 150 includes body 152, mounting tab 154, and a plurality of legs 156. Device 150 can be coupled to heat sink 100 using mounting tab 154.

Heat sink 100 is formed from sheet metal using a stamping process. Heat sink 100 can be coupled to device 150 using a separate screw 160 and nut 170. Anti-tipping legs 102 and spring clips 104 may not be required if heat sink 100 is small enough that the legs 156 of device 150 are sufficient to support it. For greater thermal dissipation capacities, however, the heat sink 100 may be too bulky to be supported by the legs 156 of device 150. In such cases, the heat sink 100 must be coupled to motherboard 180 for stability. In one embodiment, spring clips 104 are coupled to the motherboard 180, for example, by solder. Heat sink 100 can then be clipped onto the spring clips. Anti-tipping legs 102 aid in supporting the heat sink 100 so that the heat sink cannot rock with respect to the motherboard 180.

The heat sink of FIG. 1 requires several additional steps at the time of assembling the motherboard 180. For example, the heat sink 100 and the device 150 must be aligned so that screw 160, mounting tab 154, hole 106, and nut 170 (i.e., four elements) are aligned.

Moreover, affixing the device 150 to heat sink 100 requires care to ensure that the device 150 does not rotate with respect to heat sink 100 when tightening screw 160 or nut 170. Otherwise, one or both of device 150 and heat sink 100 may no longer be aligned for proper mounting on motherboard 180.

Heat sink 100 is coupled to motherboard 180 using spring clips 104 to hold the heat sink 100. When coupling the heat sink 100 to the motherboard spring clips 104 can either be located in a pre-determined location on the heat sink or they can be soldered to motherboard 180 using a separate soldering operation from that of when device 150 is soldered to the motherboard 180. Thus one technique for mounting the heat sink 100 to the motherboard 180 is dependent upon ensuring that the movable spring clips 104 are predictably located in the same position on the heat sink. The other technique requires an additional soldering step.

Figure 2:
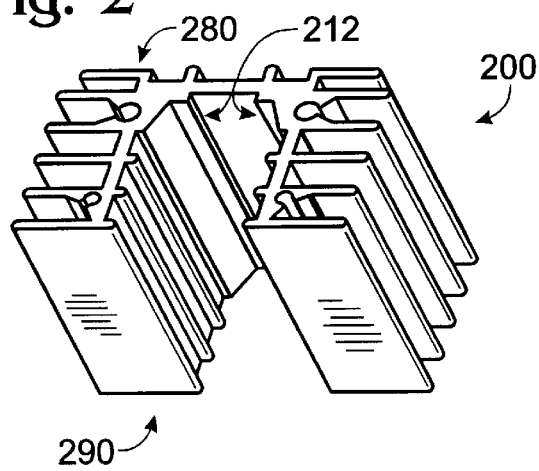
FIG. 2 illustrates one embodiment of an improved heat sink with a body capable of being manufactured through extrusion.
Figure 3:
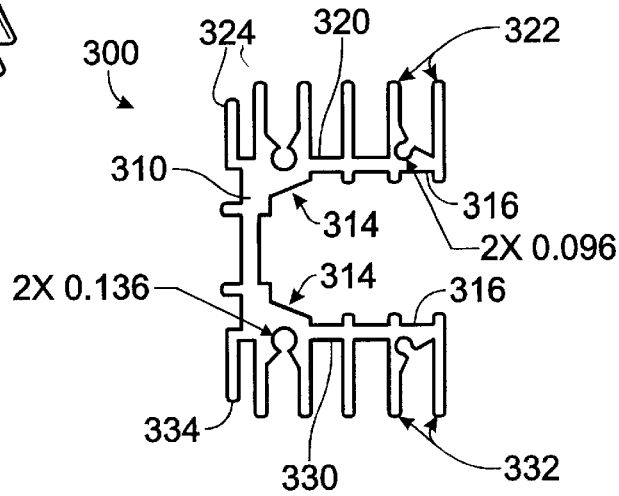
FIG. 3 illustrates a top view of the heat sink.

FIG. 2 illustrates one perspective view of an improved heat sink 200 for use with a device such as the voltage regulator of FIG. 1. FIG. 3 illustrates a top view of the heat sink 300. The heat sink includes a first wall 320, a second wall 330, and a mounting block 310 which form a substantially U-shaped heat sink. In one embodiment, the heat sink is formed through an extrusion process. Heat sink 200 includes a number of features that ease the process of mounting the heat sink to a motherboard as well as mounting the device to be cooled to the heat sink.

Referring to FIGS. 2 and 3, the heat sink includes a U-shaped top 280 and a U-shaped base 290. The heat sink 200 includes a channel 212 in the mounting block 310. The device to be cooled is fastened to the heat sink at the mounting block 310. The channel 212 is sized to permit holding the device being affixed without substantial rotation with respect to the heat sink. Thus once the device is in the channel, a fastener can be tightened without substantially rotating the heat sink with respect to the device being cooled.

Although rotation may be acceptable with respect to heat sinks supported by the legs of the device being cooled, heavier heat sinks cannot rely on the legs of the device for support and must be attached to the motherboard. Rotation of the heat sink with respect to the device during assembly may prevent one or both of the device and the heat sink from being properly seated with respect to the motherboard. Thus the channel helps to minimize rotation of the heat sink with respect to the device when coupling the two together.

Figure 4:
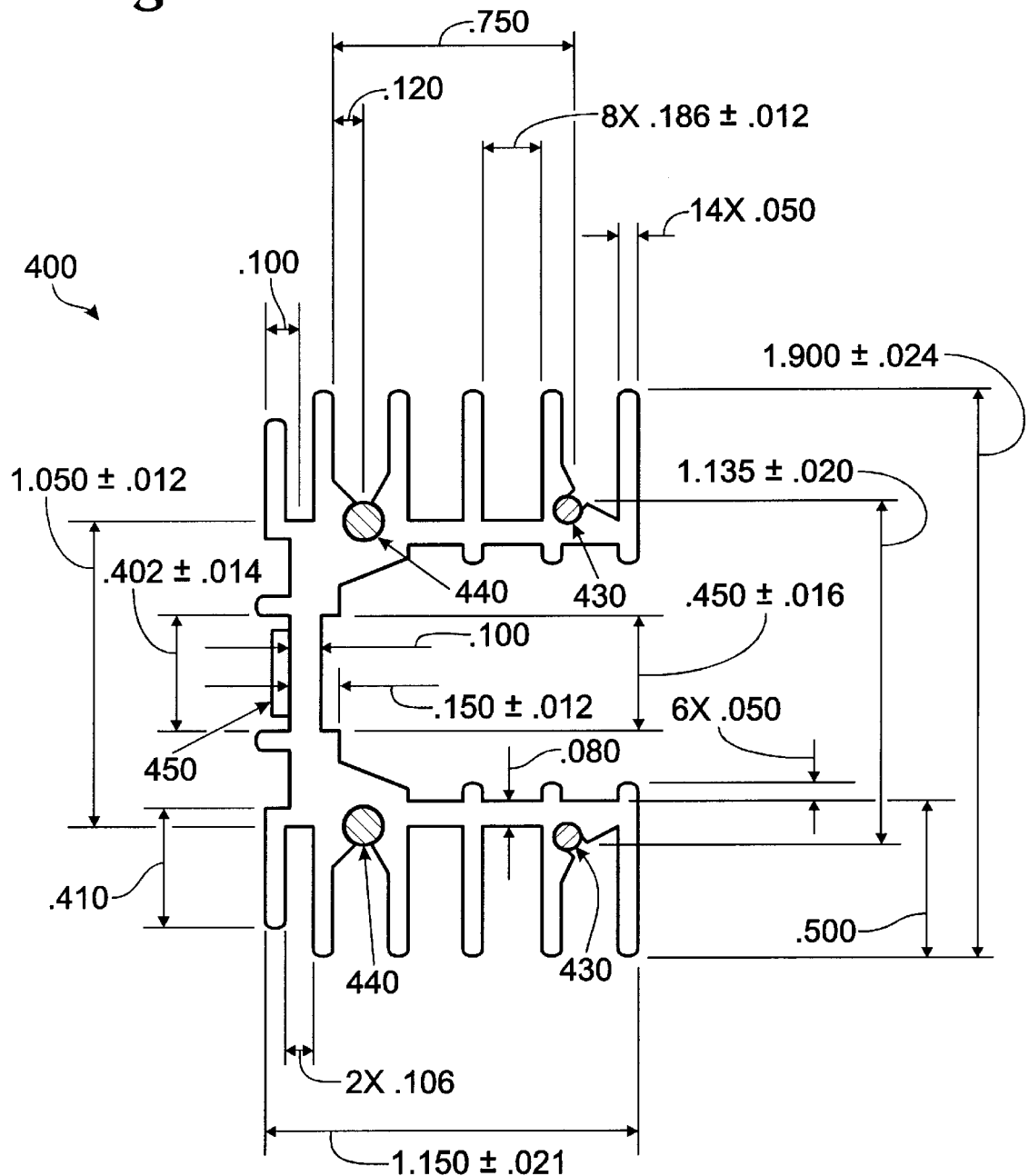
FIG. 4 illustrates a bottom view of the heat sink.
Figure 5:
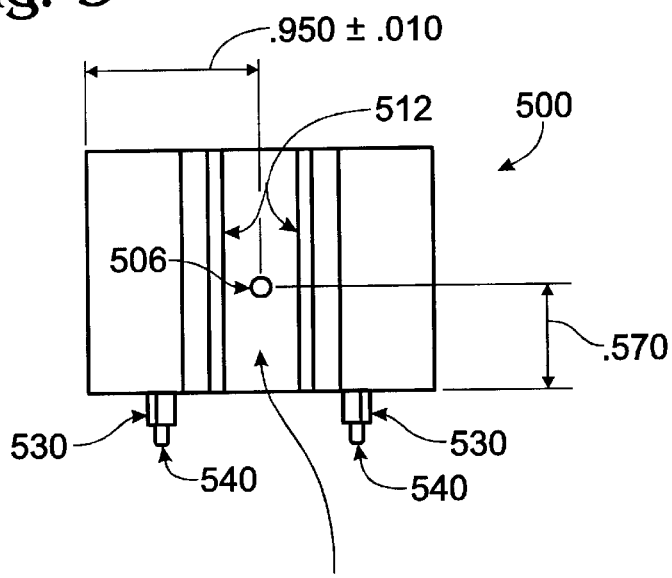
FIG. 5 illustrates a front view of the heat sink.

FIG. 4 illustrates a bottom view of heat sink 400 with dimensional details. In one embodiment, a self-clenching threaded nut 450 is coupled to a back of the mounting block of the heat sink. FIG. 5 illustrates a front view of the heat sink 500 including a hole 506 disposed in channel 512. The nut 450 of FIG. 4 is aligned over the hole 506 through the channel 512.

In an alternative embodiment, the mounting block hole 506 could be threaded in order to eliminate the nut 450. Typical fasteners such as screws are made from a different material than what the heat sink is. For example, the heat sink could be aluminum. The fastener, however, may be a steel screw. The threaded hole 506 of an aluminum heat sink may not provide sufficient holding strength for the steel screw. Thus the use of a nut 450 may be preferable over simply threading the mounting block hole 506.

Attempting to fasten the device being cooled to the heat sink with a separate screw and nut as illustrated in FIG. 1 requires aligning the screw 160, the hole in the mounting tab 154 of the device, the hole 106 in the heat sink, and the nut 170 at the time the device is being fastened to the heat sink (i.e., 4 components). The improved heat sink, however, requires aligning the device mounting tab 154, the screw, and the hole 506 (i.e., three components). The channel also helps eliminate a few degrees of freedom with respect to alignment. Manufacturing the heat sink with nut 450 and channel 212 simplifies alignment problems by reducing the rotation of the device with respect to the heat sink as well as reducing the number of elements that must be individually aligned when the device is being fastened to the heat sink, for example, by tightening a screw.

Referring to FIG. 2, the bottom of the heat sink is referred to as the mounting face or base 290. Base 290 is used when mounting the heat sink to the motherboard. As can be seen from FIGS. 2, 3, 4, and 6, heat sink 300 includes a plurality of vertical convection fins (e.g., 322, 324, 332, 334) that extend from the U-shaped base 290 to the U-shaped top 280 of the heat sink.

In one embodiment, the fins are not all equidistant from each other. One pair of convection fins (324, 334) has a smaller separation distance from the other fins, than do the other fins with respect to each other. Moreover, convection fins 324 and 334 are located behind the mounting block 310 of heat sink 300. In one embodiment, convection fins 324 and 334 have a narrower width than the other fins (as detailed in FIG. 4) in order to accommodate components placed in close proximity to the heat sink on the motherboard.

Figure 6:
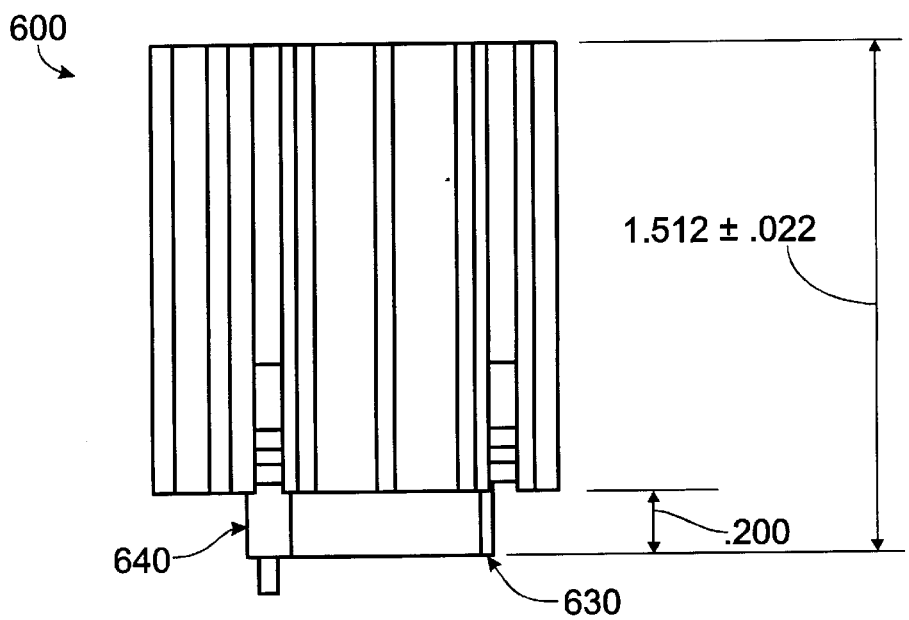
FIG. 6 illustrates a side view of the heat sink.

Referring to FIGS. 5 and 6, the improved heat sink includes a number of mounting pins coupled to its base. For example, a front view of the heat sink 500 with mounting pins 540 is illustrated in FIG. 5. A side view of heat sink 600 illustrates mounting pin 640.

The mounting pins can be soldered to mounting pads on the motherboard once inserted into the motherboard. When the heat sink is formed using an extrusion process, the pins must be affixed to the heat sink in a separate manufacturing step. The pins can be separately manufactured and inserted into the heat sink. As can be seen in the side view of FIG. 6, the mounting pin 640 is inserted into heat sink 600 so that a portion of the mounting pin 640 is disposed within the heat sink 600. FIG. 4 illustrates the precise location of the holes 440 for the mounting pins.

Figure 7:
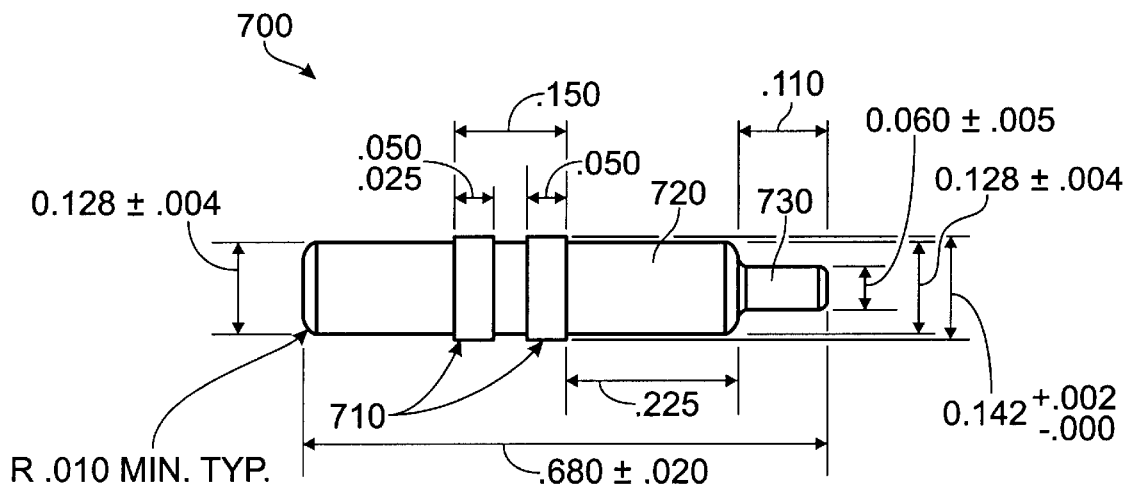
FIG. 7 illustrates a mounting pin.

FIG. 7 illustrates one embodiment of a mounting pin 700. Mounting pin 700 includes a knurled portion 710. Once mounting pin 700 is inserted into the heat sink, knurled portion 710 serves to retain mounting pin 700 in the heat sink. In one embodiment, a 50 teeth-per-inch (TPI) diamond pattern is used for knurl 710. In one embodiment, the mounting pin 700 is a steel mounting pin.

Mounting pin 700 further includes a shoulder portion 720 and a tip 730. In the embodiment illustrated in FIG. 7, mounting pin 700 is substantially cylindrical. The perimeter of shoulder 720 is greater than the perimeter of tip 730. The tip is inserted into a via in the motherboard. The via, however, does not have sufficient diameter to permit the shoulder 720 to pass. If the shoulder 720 is not flush with the base of the heat sink, the shoulder serves as a standoff to ensure that the base of the heat sink does not contact the motherboard. The tip portion 730 aids in proper orientation of the heat sink with respect to the motherboard vias. Moreover, the tip portion 730 serves as an anchor when the mounting pins are soldered to the motherboard.

In one embodiment, the improved heat sink includes anti-tipping pins 530 as illustrated in the front view of heat sink 500 in FIG. 5. Anti-tipping pins 530 help prevent the heat sink 500 from rocking back and forth. The anti-tipping pins 530 also tend to reduce strain on the mounting pins 540 when the heat sink 500 is mounted on the motherboard. Anti-tipping pins 530 are designed to rest on the motherboard. Anti-tipping pins maintain substantially the same distance between the motherboard and the base of the heat sink as the stand-off spacing provided by the mounting pins.

When the heat sink is formed using an extrusion process, the anti-tipping pins must be affixed to the base of the heat sink in a separate manufacturing step. The anti-tipping pins can be separately manufactured and inserted into the base of the heat sink. As can be seen in the side view of FIG. 6, anti-tipping pin 630 is inserted into heat sink 600 so that a portion of the anti-tipping pin 630 is disposed within the heat sink 600. FIG. 4 illustrates the location of the holes 430 for the anti-tipping pins.

Figure 8:
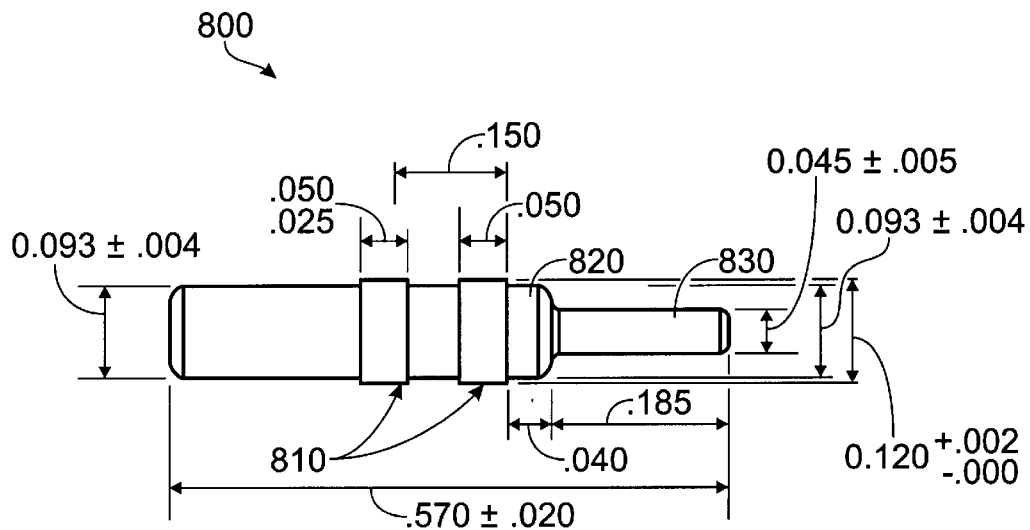
FIG. 8 illustrates an anti-tipping pin.

FIG. 8 illustrates one embodiment of an anti-tipping pin 800. Anti-tipping pin 800 includes a knurled portion 810 for retaining the pin within the heat sink after insertion. In one embodiment, a 50 TPI diamond pattern is used for knurl 810. In one embodiment, the anti-tipping pin 800 is a steel mounting pin.

In one embodiment, the anti-tipping pins are substantially cylindrical. The tip portion 830 of the anti-tipping pin 800 can have a substantially smaller perimeter than the shoulder 820 of anti-tipping pin 800. The anti-tipping pins should not rest on a motherboard trace when the heat sink is mounted to the motherboard. Smaller tip portions 830 allow the anti-tipping pins to be located in an area of higher density traces and generally provide greater flexibility with respect to routing of motherboard traces.

Referring to FIG. 3, the heat sink includes additional fillet 314 formed between the mounting block 310 and the first and second walls (320, 330). The additional fillet 314 serves as material for the mounting pins to grip. In one embodiment, the mounting pin holes extend through the heat sink vertically from the base to the top of the heat sink (see, e.g., FIGS. 1, 4, and 6). The additional fillet 314 also adds structural integrity to the U shape of the heat sink 300.

The heat sink also includes additional fillet 316 between a few of the fins (322, 332). Although this additional fillet 316 is not necessary for the structural integrity of the U-shape, additional fillet 316 serves as supporting material for the friction fit of the anti-tipping pins. In one embodiment, the anti-tipping pin holes extend through the heat sink vertically from the base to the top of the heat sink (see, e.g., FIGS. 1, 4, and 6).

Thermal interface material may be applied to the heat sink channel to facilitate consistent thermal transfer characteristics. FIG. 5 illustrates one embodiment in which a dry interface material is applied to channel 512. In one embodiment, the interface material is approximately 0.35" (W)×0.65" (H)×0.005" thick with a thermal impedance of approximately 0.08 ° C. in$^2$/watt. The dry interface material should not overlap the vertical edges of the channel.

Application of a dry interface material at the time of manufacturing the heat sink reduces the number of assembly steps at the time of fastening the device being cooled (e.g., a regulator) to the heat sink. In alternative embodiments, the thermal interface material may be applied at the time of assembly. In alternative embodiments, other thermal transfer materials can be used. For example, interface grease or pads can be used if desired.

In one embodiment, the heat sink is anodized. Anodization serves functional as well as aesthetic purposes. Anodization allows production of heat sinks with consistent cosmetic coloration (e.g., black, red, blue, etc.). Moreover, anodization creates a substantially non-electrically conductive surface for the heat sink.

These heat sink improvements can be used individually or in combination. Thus a heat sink design capable of being extruded includes a first wall, a second wall, and a mounting block which form a substantially U-shaped body having a top and a base. The heat sink includes a plurality of vertical convection fins extending from the base to the top of the heat sink. The mounting block includes a channel to facilitate fastening the heat sink to a device without any substantial relative rotation during the fastening process. In one embodiment, a nut is fastened to the back of the heat sink such that the nut is aligned over a hole in the channel. The heat sink includes a plurality of mounting pins and a plurality of anti-tipping pins inserted into its base. Additional fillet material provides a gripping surface so that the mounting and anti-tipping pins can be anchored in the heat sink.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A heat sink comprising:
   a first wall having a first end and a second end;
   a second wall having a first end and a second end;
   a mounting block thermally coupled to the first end of each of the first and second walls forming a substantially U-shaped body and having:
      a recessed channel set within the mounting block to substantially eliminate relative rotation between the heat sink and a device to be fastened to a front of the mounting block, and
      a hole disposed within the recessed channel; and
   a plurality of substantially cylindrical anti-tipping pins having a knurled portion for retaining the pins within the heat sink, wherein at least one anti-tipping pin is coupled to a base of the first wall, and wherein at least one anti-tipping pin is coupled to a base of the second wall.

2. The heat sink of claim 1, further comprising:
   a threaded nut fastened to a back of the mounting block, wherein the nut is aligned over the hole.

3. The heat sink of claim 1, further comprising:
   a plurality of mounting pins, wherein at least one mounting pin is coupled to the base of the first wall, and wherein at least one mounting pin is coupled to the base of the second wall.

4. The heat sink of claim 3, wherein the mounting pins include a tip and a shoulder, and wherein a perimeter of the shoulder is greater than a perimeter of the tip.

5. The heat sink of claim 3, wherein the mounting pins are substantially cylindrical.

6. The heat sink of claim 1, wherein each of the first and second walls has a plurality of vertical convection fins, wherein the convection fins are not equally spaced on the first and second walls.

7. The heat sink of claim 6, further comprising at least one pair of vertical convection fins attached to a back of the mounting block.

8. A heat sink comprising:
   a first wall having a first end and a second end;
   a second wall having a first end and a second end;
   a mounting block thermally coupled to the first end of each of the first and second walls forming a substantially U-shaped body and having:

a recessed channel set within the mounting block to substantially eliminate relative rotation between the heat sink and a device to be fastened to a front of the mounting block, and a hole disposed within the recessed channel; and a first fillet formed between the mounting block and the first wall; and a second fillet formed between the mounting block and the second wall.

9. The heat sink of claim 8, further comprising:

a threaded nut fastened to a back of the mounting block, wherein the nut is aligned over the hole.

10. The heat sink of claim 8, further comprising:

a plurality of mounting pins, wherein at least one mounting pin is coupled to the base of the first wall, and wherein at least one mounting pin is coupled to the base of the second wall.

11. The heat sink of claim 10, wherein the mounting pins include a tip and a shoulder, and wherein a perimeter of the shoulder is greater than a perimeter of the tip.

12. The heat sink of claim 10, wherein the mounting pins are substantially cylindrical.

13. The heat sink of claim 8, wherein each of the first and second walls has a plurality of vertical convection fins, wherein the convection fins are not equally spaced on the first and second walls.

14. The heat sink of claim 13, further comprising at least one pair of vertical convection fins attached to a back of the mounting block.

15. The heat sink of claim 8, further comprising:

at least two anti-tipping pins inserted into the base, wherein at least a portion of each anti-tipping pin is disposed within the U-shaped body.

16. A heat sink comprising:

a first wall having a first end and a second end;

a second wall having a first end and a second end;

a mounting block thermally coupled to the first end of each of the first and second walls forming a substantially U-shaped body and having:

a recessed channel set within the mounting block to substantially eliminate relative rotation between the heat sink and a device to be fastened to a front of the mounting block, and a hole disposed within the recessed channel; and a fillet formed between the mounting block and at least one of the first and second walls.

17. The heat sink of claim 16, further comprising:

a plurality of mounting pins, wherein at least one mounting pin is coupled to the base of the first wall, and wherein at least one mounting pin is coupled to the base of the second wall.

18. A heat sink comprising:

a first wall having a first end and a second end;

a second wall having a first end and a second end;

a mounting block thermally coupled to the first end of each of the first and second walls forming a substantially U-shaped body and having a recessed channel set within the mounting block to substantially eliminate relative rotation between the heat sink and a device to be fastened to a front of the mounting block; and a fillet formed between the mounting block and at least one of the first and second walls.

19. The heat sink of claim 18, further comprising:

at least two mounting pins inserted into the base, wherein at least a portion of each mounting pin is disposed within the U-shaped body.

20. The heat sink of claim 19, wherein the mounting pins include a tip and a shoulder, and wherein a perimeter of the shoulder is greater than a perimeter of the tip.

* * * * *